United States Patent
Liao

(10) Patent No.: US 9,407,226 B2
(45) Date of Patent: Aug. 2, 2016

(54) GAIN CONTROL IN COMPLEMENTARY COMMON GATE AND COMMON SOURCE AMPLIFIERS

(71) Applicant: QUALCOMM Incorporated, San Diego, CA (US)

(72) Inventor: Chih-Fan Liao, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/575,851

(22) Filed: Dec. 18, 2014

(65) Prior Publication Data

US 2016/0182000 A1    Jun. 23, 2016

(51) Int. Cl.
H03F 1/22    (2006.01)
H03G 3/30    (2006.01)
H03F 3/19    (2006.01)

(52) U.S. Cl.
CPC ............... *H03G 3/3036* (2013.01); *H03F 3/19* (2013.01); *H03F 2200/451* (2013.01); *H03F 2200/54* (2013.01)

(58) Field of Classification Search
CPC ........... H03F 1/22; H03F 1/223; H03F 1/226; H03F 3/45
USPC ................... 330/253, 254, 261, 311
See application file for complete search history.

(56) References Cited

U.S. PATENT DOCUMENTS

| | | | |
|---|---|---|---|
| 7,420,386 B2 | 9/2008 | Wang et al. | |
| 7,671,686 B2 * | 3/2010 | Kuo | H03F 3/19 330/253 |
| 7,729,672 B2 | 6/2010 | Deng et al. | |
| 8,456,237 B2 | 6/2013 | Huang et al. | |
| 8,577,325 B2 | 11/2013 | Lee et al. | |
| 2011/0063032 A1 | 3/2011 | Lee | |
| 2011/0109389 A1 * | 5/2011 | Beffa | H03F 1/223 330/260 |
| 2014/0171005 A1 | 6/2014 | Mikhemar et al. | |
| 2014/0197886 A1 | 7/2014 | Rangarajan et al. | |

OTHER PUBLICATIONS

Chiu T-L., et al., "A Receiver Front-end with Variable-gain Control for WiMAX Applications," Microwave Conference Proceedings (APMC), 2010 Asia-Pacific, IEEE, Dec. 7, 2010, pp. 354-357, XP031929112, ISBN: 978-1-4244-7590-2.

International Search Report and Written Opinion—PCT/US2015/061142—ISA/EPO—Feb. 23, 2016.

Thomas M., et al., "Exploiting the Common-mode Signal in xDSL," 2004 12th European Signal Processing Conference, IEEE, Sep. 6, 2004, pp. 1217-1220, XP032760479, ISBN: 978-3-200-00165-7 [retrieved on Apr. 3, 2015].

* cited by examiner

*Primary Examiner* — Steven J Mottola
(74) *Attorney, Agent, or Firm* — Procopio, Cory, Hargreaves & Savitch, LLP

(57) ABSTRACT

Gain control in complementary common gate and common source amplifiers is disclosed. In an exemplary embodiment, an apparatus includes a first amplifier stage configured to amplify an input signal at an input terminal to generate a first amplified signal. The first amplifier stage includes a current diverter that selectively diverts current to set a gain of the first amplifier stage. The apparatus also includes a second amplifier stage configured to amplify the input signal at the input terminal to generate a second amplified signal. The second amplifier stage includes a gain control circuit to set a gain of the second amplifier stage.

18 Claims, 8 Drawing Sheets

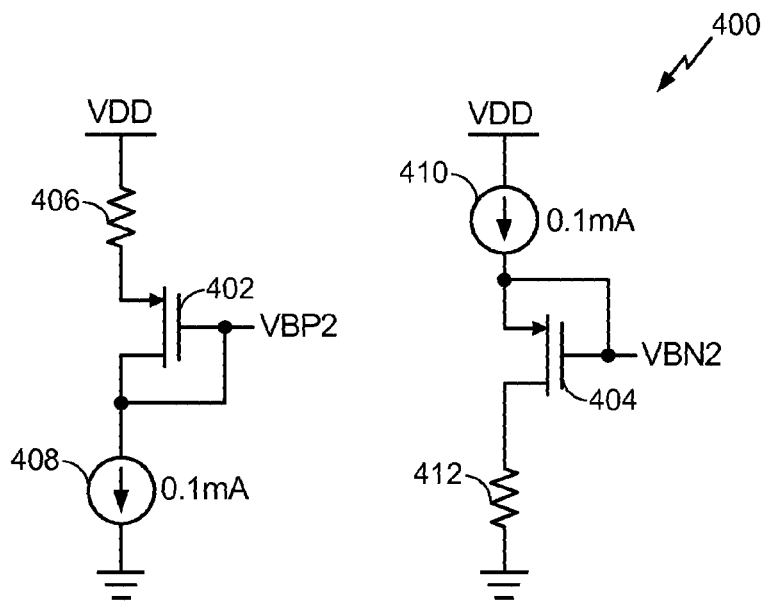
FIG. 4
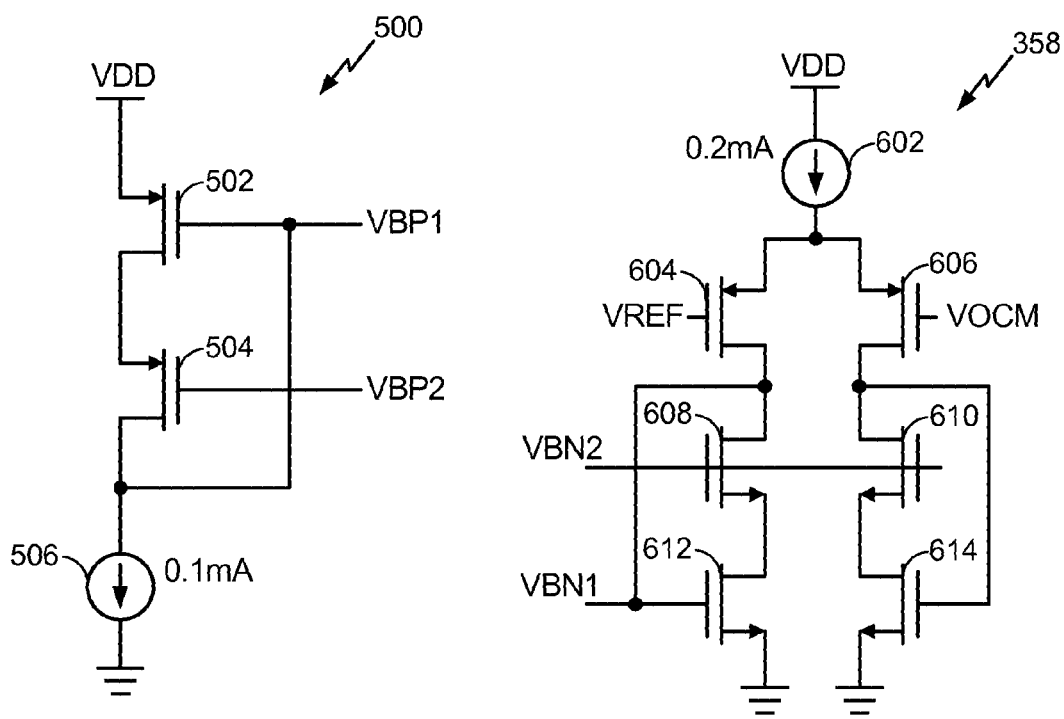
FIG. 5  FIG. 6

GAIN CONTROL IN COMPLEMENTARY COMMON GATE AND COMMON SOURCE AMPLIFIERS

BACKGROUND

I. Field

The present disclosure relates generally to amplifiers, and more specifically to gain control in low-noise amplifiers.

II. Background

A wireless device (e.g., a cellular phone or a smartphone) in a wireless communication system may transmit and receive data for two-way communication. For example, the wireless device may operate in a frequency division duplexing (FDD) system or in a time division duplexing system (TDD). The wireless device may include a transmitter for data transmission and a receiver for data reception. Thus, the wireless device may process both analog and digital signals in order to provide communication and/or data services.

Receivers in wireless devices are used to receive and demodulate received RF signals. A typical receiver includes a low noise amplifier (LNA) to amplify received RF signals prior to demodulation. Impedance matching, isolation, and linearity are the major concerns for LNAs in receivers. For example, it is desirable that the LNA provide an input impedance, typically 50 ohms, to match the impedance of a receiving antenna. The LNA should also provide accurate gain control so that the amplification applied to the received RF signals prior to demodulation can be accurately controlled.

Unfortunately, conventional LNAs may utilize several external components in order to provide the desired input impedance. This increases the circuit area required by the LNA. Also, accurate gain control may be a problem since adjustments to gain in a convention LNA may affect the input impedance.

It is therefore desirable to have a low power amplifier having gain control with constant input impedance that overcomes the disadvantages of conventional circuits.

BRIEF DESCRIPTION OF THE DRAWINGS

FIG. 4 shows an exemplary embodiment of bias circuits for use with the amplification circuit shown in FIG. 3.

FIG. 5 shows an exemplary embodiment of a bias circuit for use with the amplification circuit shown in FIG. 3.

FIG. 6 shows an exemplary embodiment of a comparator for use with the amplification circuit shown in FIG. 3.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
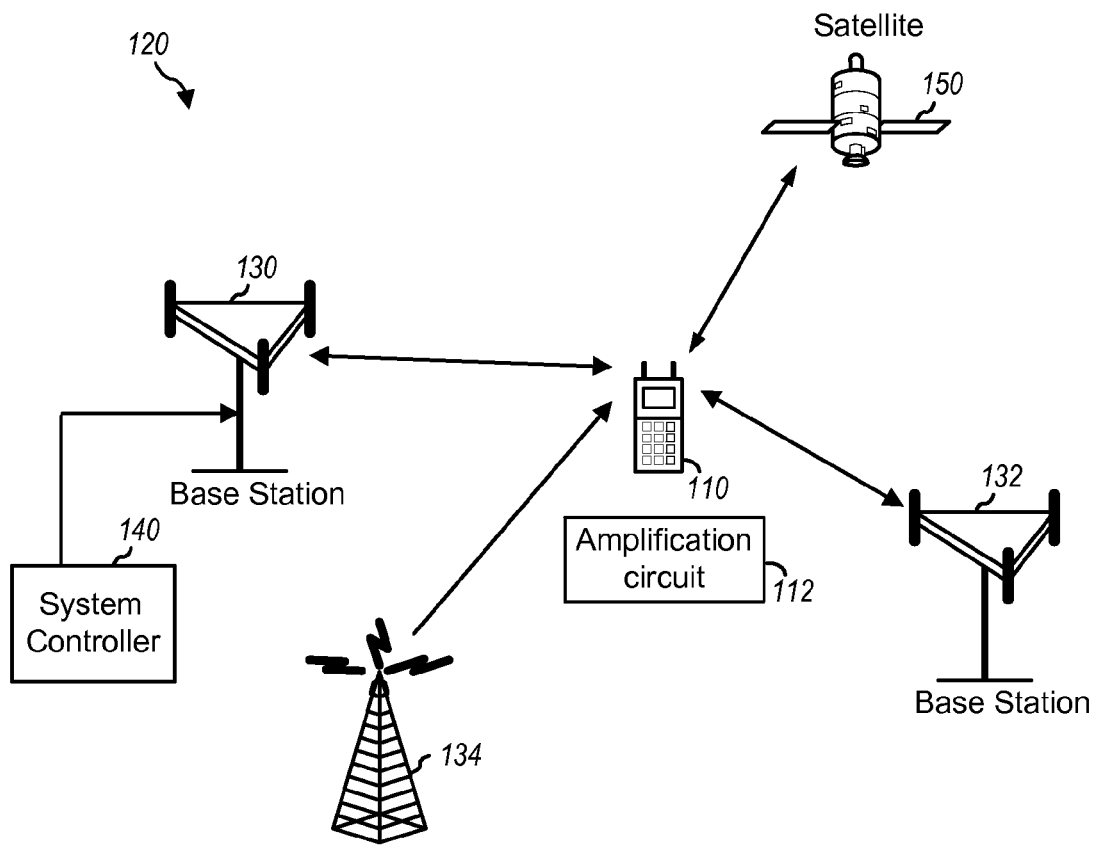
FIG. 1 shows an exemplary embodiment of an amplification circuit for use in a wireless device communicating within a wireless system.

FIG. 1 shows an exemplary embodiment of an amplification circuit 112 for use in a wireless device 110 communicating within a wireless system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless system 120 including two base stations 130 and 132 and one system controller 140. In general, wireless system 120 may include any number of base stations and any set of network entities.

Wireless device 110 may also be referred to as a user equipment (UE), a mobile station, a terminal, an access terminal, a subscriber unit, a station, or other communication device. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, or other communication device. Wireless device 110 may communicate with devices in the wireless system 120. Wireless device 110 may also receive signals from broadcast stations (e.g., a broadcast station 134), or signals from satellites (e.g., a satellite 150) in one or more global navigation satellite systems (GNSS). Wireless device 110 may support one or more radio technologies for wireless communication such as LTE, WCDMA, CDMA 1X, EVDO, TD-SCDMA, GSM, and 802.11. In an exemplary embodiment, the wireless device 110 comprises the amplification circuit 112 to provide amplification for use with various circuitries in the wireless device 110. For example, the amplification circuit 112 provides amplification for signals received by a receiver in the wireless device 110. The amplification circuit 112 is designed to utilize less power and circuit area than conventional amplifiers while providing adjustable gain and constant input impedance.

Figure 2:
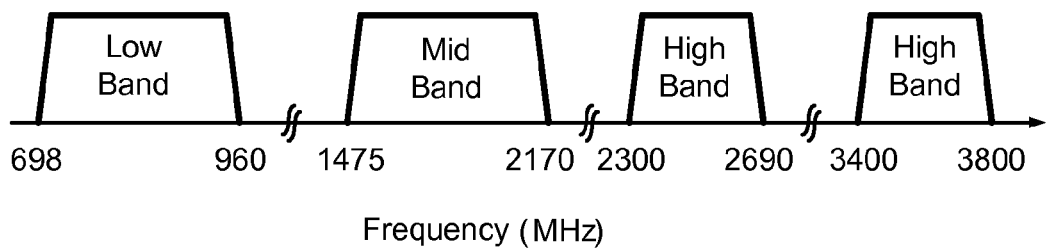
FIG. 2 shows three exemplary band groups in which exemplary embodiments of the amplification circuit shown in FIG. 1 may operate.

FIG. 2 shows three exemplary band groups in which exemplary embodiments of the wireless device 110 may operate. Wireless device 110 may operate in a low-band (LB) covering frequencies lower than 1000 megahertz (MHz), a mid-band (MB) covering frequencies from 1000 MHz to 2300 MHz, and/or a high-band (HB) covering frequencies higher than 2300 MHz. For example, the low-band may cover 698 to 960 MHz, the mid-band may cover 1475 to 2170 MHz, and the high-band may cover 2300 to 2690 MHz and 3400 to 3800 MHz, as shown in FIG. 2. The low-band, mid-band, and high-band refer to three groups of bands (or band groups), with each band group including a number of frequency bands (or simply, "bands"). Each band may cover up to 200 MHz. LTE Release 11 supports 35 bands, which are referred to as LTE/UMTS bands and are listed in 3GPP TS 36.101.

In general, any number of band groups may be defined. Each band group may cover any range of frequencies, which may or may not match any of the frequency ranges shown in FIG. 2. Each band group may also include any number of bands. In various exemplary embodiments, the amplification circuit 112 is suitable for use within the various band groups to amplify signals within the wireless device 110.

Figure 3:
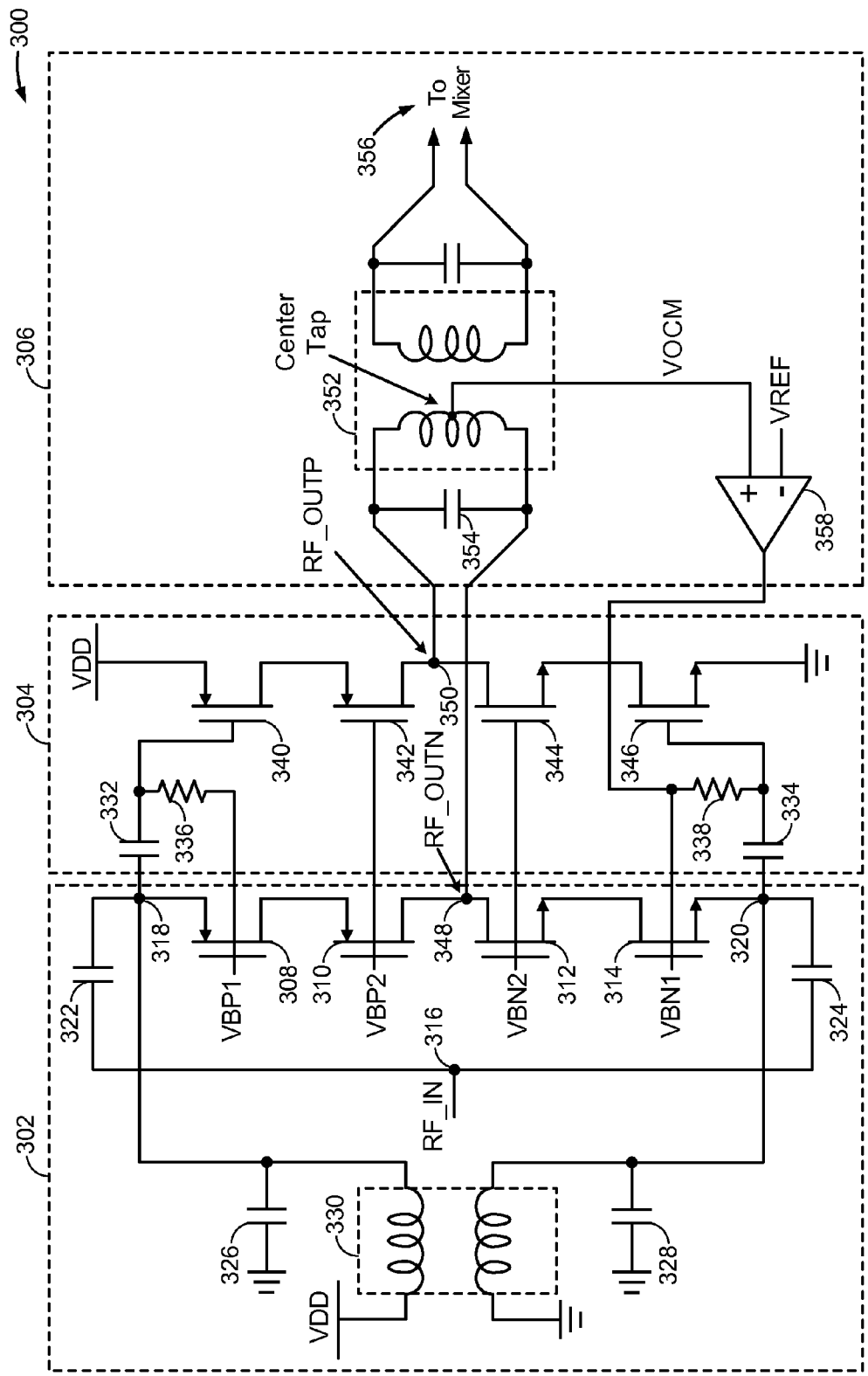
FIG. 3 shows an exemplary embodiment of an amplification circuit.

FIG. 3 shows an exemplary embodiment of an amplification circuit 300. The amplification circuit 300 is suitable for use as the amplification circuit 112 shown in FIG. 1. The amplification circuit 300 includes a complementary common gate amplifier stage 302, a complementary common source amplifier stage 304, and a summation circuit 306.

The complementary common gate amplifier stage 302 includes PMOS transistors 308, 310, and NMOS transistors 312, 314. A single-ended RF input signal is received at an input terminal 316 that is connected to capacitors 322 and 324. The capacitor 322 is connected to node 318 that is further connected to a source terminal of the transistor 308. The capacitor 324 is connected to node 320 that is further connected to a source terminal of the transistor 314. The node 318 is connected to a signal ground through capacitor 326 and to a voltage supply (VDD) through a first winding of transformer 330. The node 320 is connected to the signal ground through capacitor 328 and through a seconding winding of the transformer 330. The transformer 330 comprises windings in a ratio of (1:1) since transistor 308 and transistor 314 are also sized to deliver the same gm. For example, the NMOS side and the PMOS side of amplifier stage 302 are designed symmetrically to have better IIP2 performance. The complementary common gate amplifier stage 302 outputs a non-inverted first amplified output signal (RF_outp) from the node 348.

The transistor 308 has a gate terminal that is connected to a first "P" bias signal (VBP1), and the transistor 310 has a gate terminal that is connected to a second "P" bias signal (VBP2). The transistor 314 has a gate terminal that is connected to a first "N" bias signal (VBN1), and the transistor 312 has a gate terminal that is connected to a second "N" bias signal (VBN2).

The complementary common source amplifier stage 304 includes PMOS transistors 340, 342, and NMOS transistors 344, 346. The transistor 340 has a gate terminal connected to a first terminal of capacitor 332 and a second terminal of capacitor 332 is connected to the node 318. The gate terminal of the transistor 340 is connected to a first terminal of resistor 336 and a second terminal of resistor 336 is connected to receive the VBP1 bias signal. The transistor 346 has a gate terminal connected to a first terminal of capacitor 334 and a second terminal of the capacitor 334 is connected to the node 320. The gate terminal of the transistor 346 is also connected to a first terminal of the resistor 338 and a second terminal of the resistor 338 is connected to receive the VBN1 bias signal. The transistor 342 has a gate terminal connected to receive the VBP2 bias signal and the transistor 344 has a gate terminal connected to receive the VBN2 bias signal. A second amplified output signal (RF_outp) that is inverted from the input signal is output from the node 350.

In an exemplary embodiment, the capacitors 332, 326, 328, 334, and 354 have capacitance values on the order of a few picofarads (pF). The resistors 336 and 338 have resistance values in the range of 20-40 kohms (20 k~40 k). In an exemplary embodiment, the transistors shown in FIG. 3 are sized to provide a selected amount of gm for the given power consumption budget. For example, the amplifier circuit 300 is designed to provide 50 ohm input impedance, so the gm of transistor 314 and the gm of transistor 308 may be designed to be 10 mS each. Accordingly, the gm of transistor 346 and the gm of transistor 340 are designed to be 10 mS each to facilitate the cancellation of any noise or distortion produced by transistors 308 and 314.

The summation circuit 306 includes a transformer 352 that has a first terminal of a first winding connected to the node 348 to receive the first amplified output signal and a second terminal of the first winding connected to the node 350 to receive the second amplified output signal. A capacitor 354 is connected across the first winding of the transformer 352. A second winding of the transformer 352 outputs a balanced differential RF signal to a down-converting mixer circuit (not shown). In an exemplary embodiment, the transformer 352 comprises a winding ratio that is set depending on the desired receiver gain and the amount of gain the amplifier 300 and downstream mixer are designed to provide to suppress the noise from the IF stage (e.g., baseband IF filter).

A center tap of the first winding of the transformer 352 outputs a common mode voltage signal (VOCM) that is connected to a non-inverting input of comparator 358. An inverting input of the comparator 358 is connected to receive a voltage reference signal (VREF). An output terminal of the comparator 358 outputs the bias signal VBN1. In an exemplary embodiment of the comparator 358 shown in FIG. 6, the comparator 358 also receives and utilizes the bias signal VBN2 to generate its output signal.

FIG. 4 shows an exemplary embodiment of bias circuits 400 for use with the amplification circuit 300 shown in FIG. 3. The bias circuits 400 generate the bias signals identified in the amplification circuit 300. A first bias circuit includes PMOS transistor 402 that has a source terminal connected to a first terminal of a resistor 406 and the resistor 406 has a second terminal connected to the voltage supply (VDD). In an exemplary embodiment, the resistor 406 has a resistance value in the range of (1 to 5) kohms. The transistor 402 has a drain terminal connected to a first terminal of a current source 408 and the current source 408 has a second terminal connected to the signal ground. In an exemplary embodiment, the current source 408 provides approximately 0.1 milliamps of current. For example, in an exemplary embodiment, the current source 408 (and other current sources shown in the embodiments) is an NMOS transistor operating in the saturation region to behave as a current source to provide the desired amount of current. A gate terminal of the transistor 402 is connected to the drain terminal and also outputs the bias signal VBP2.

A second bias circuit includes NMOS transistor 404 that has a source terminal connected to a first terminal of a resistor 412 and the resistor 412 (e.g., 1-5 kohms) has a second terminal connected to the signal ground. The transistor 404 has a drain terminal connected to a first terminal of a current source 410 to receive a current and the current source 410 has a second terminal connected to the supply voltage (VDD). In an exemplary embodiment, the current source 410 supplies approximately 0.1 milliamps of current. A gate terminal of the transistor 404 is connected to the source terminal and also outputs the bias signal VBN2.

FIG. 5 shows an exemplary embodiment of a bias circuit 500 for use with the amplification circuit 300 shown in FIG. 3. The bias circuit 500 generates bias signals identified in the amplification circuit 300. The bias circuit 500 includes PMOS transistors 502 and 504. The transistor 502 has a source terminal connected to the supply voltage (VDD) and a drain terminal connected to a source terminal of the transistor 504. A gate terminal of the transistor 502 is connected to a drain terminal of the transistor 504, and also outputs the bias signal VBP1. A gate terminal of the transistor 504 receives the bias signal VBP2 that is output from the transistor 402 shown in FIG. 4. The drain terminal of the transistor 504 is connected to a first terminal of current source 506 and the current source 506 has a second terminal that is connected to the signal ground. In an exemplary embodiment, the current source 506 supplies approximately 0.1 milliamps of current.

FIG. 6 shows a detailed exemplary embodiment of the comparator 358 shown in FIG. 3. The comparator 358 receives the VBN2 signal, the voltage reference signal (VREF), and the common mode voltage signal (VOCM) and generates the bias signal VBN1. In an exemplary embodiment, the VREF signal has a value of VDD/2. The VREF signal can be generated by using a current source flowing through a string of resistors or by using a resistor divider connected between VDD and GND.

The comparator 358 includes a pair of PMOS transistors 604, 606, that have source terminals connected to a first terminal of a current source 602 to receive a current signal. A second terminal of the current source 602 is connected to the supply voltage (VDD). In an exemplary embodiment, the current source 602 supplies approximately 0.2 milliamps of current. The transistor 604 has a gate terminal connected to receive the voltage reference signal (VREF). The transistor 606 has a gate terminal connected to receive the common mode voltage signal (VOCM).

Drain terminals of the transistors 604, 606 are connected to drain terminals of a first NMOS transistor pair 608, 610. The drain terminals of the transistors 604, 606 also are connected to gate terminals of a second NMOS transistor pair 612, 614. The transistors 608, 610 have source terminals connected to drain terminals of the transistor 612, 614. The transistors 612, 614 have source terminal connected to the signal ground. A gate terminal of the transistor 612 outputs the bias signal VBN1. The gate terminals of the transistors, 608, 610 receive the bias signal VBN2 that is output from the transistor 404 shown in FIG. 4. In an exemplary embodiment, the comparator 358 provides a desired amount of gain for the closed feedback loop formed by the stages 302, 304 and the summation circuit 306.

Figure 7:
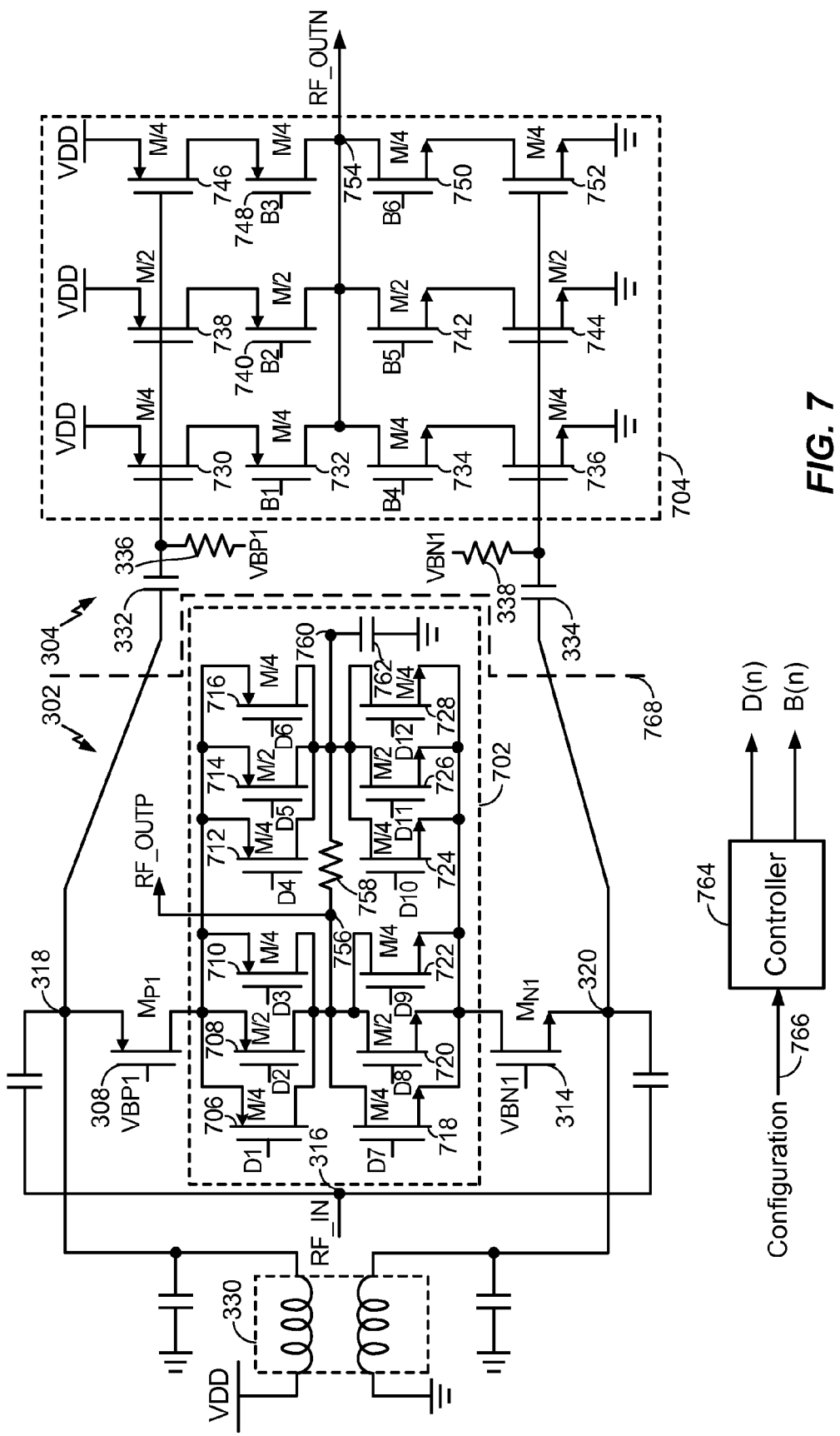
FIG. 7 shows a detailed exemplary embodiment of the amplification circuit shown in FIG. 3 that is expanded to include gain control.

FIG. 7 shows a detailed exemplary embodiment of the amplification circuit 300 that is expanded to include gain control. For example, as shown in FIG. 7, the dashed line 768 separates the complementary common gate amplifier stage 302 and the complementary common source amplifier stage 304. The complementary common gate amplifier stage 302 is expanded to include a current diverter 702 and the complementary common source amplifier stage 304 is expanded to include a current slicer 704. A controller 764 is provided that outputs control signals to control the operation of the current diverter 702 and current slicer 704 to set the gain of the amplification circuit shown in FIG. 7. For clarity, the summation circuit 306 is not shown in FIG. 7, but operates as described above as part of the amplification circuit shown in FIG. 7.

In an exemplary embodiment, the transistors 310, 312 of the complementary common gate amplifier stage 302 are replaced with the current diverter 702. The current diverter 702 includes two groups of PMOS transistors and two groups of NMOS transistors. The first group of PMOS transistors includes PMOS transistors 706, 708, and 710. The transistors 706, 708, and 710 have source terminals connected to the drain terminal of transistor 308 and have drain terminals connected to node 756, which is also connected to a first terminal of a resistor 758 (e.g., 1-5 kohms). The (non-inverted) output signal RF_OUTP is output from the node 756. The transistors 706, 708, and 710 have gate terminals connected to receive control signals D1, D2, and D3, respectively, which are generated by the controller 764.

The second group of PMOS transistors includes PMOS transistors 712, 714, and 716. The transistors 712, 714, and 716 have source terminals connected to the drain terminal of transistor 308 and have drain terminals connected to node 760. The node 760 is connected to a second terminal of the resistor 758 and to a first terminal of capacitor 762, which has a second terminal connected to the signal ground. In an exemplary embodiment, the capacitor 762 is sized to provide comparable impedance as the downstream mixer in the desired frequency range. The transistors 712, 714, and 716 have gate terminals connected to receive control signals D4, D5, and D6, respectively, which are generated by the controller 764.

The first group of NMOS transistors includes NMOS transistors 718, 720, and 722. The transistors 718, 720, and 722 have source terminals connected to the drain terminal of transistor 314 and have drain terminals connected to node 756. The transistors 718, 720, and 722 have gate terminals connected to receive control signals D7, D8, and D9, respectively, which are generated by the controller 764.

The second group of NMOS transistors includes NMOS transistors 724, 726, and 728. The transistors 724, 726, and 728 have source terminals connected to the drain terminal of transistor 314 and have drain terminals connected to node 760. The transistors 724, 726, and 728 have gate terminals connected to receive control signals D10, D11, and D12, respectively, which are generated by the controller 764.

In an exemplary embodiment, the transistor groups of NMOS and PMOS transistors of the current diverter 702 have "M" designations that indicate the number of fingers for the transistors (e.g., the multiplier for the transistors). For example, if the transistor 312 has a width of W (um), then the transistor 718 is sized at W/4, the transistor 720 is sized at W/2, and the transistor 722 is sized at W/4. Thus, the group is sized to provide a ratio of 1:2:1 for the transistor they replaced. The same is true for all the transistor groups of the current diverter 702. It should also be noted that other sizes or ratios for the transistors can be used.

In an exemplary embodiment, the transistors 340, 342, 344, and 346 of the complementary common source amplifier stage 304 are replaced with the current slicer 704. The current slicer 704 includes multiple branches that can be selectively enabled by the controller 764. A first branch includes PMOS transistors 730 and 732, and NMOS transistors 734 and 736. The transistor 730 has a source terminal connected to the supply voltage (VDD) and a drain terminal connected to a source terminal of the transistor 732. The transistor 730 has a gate terminal connected to the first terminal of the capacitor 332.

The transistor 732 has a drain terminal connected to a drain terminal of the transistor 734 and to node 754, which outputs the amplified output signal RF_OUTN. The transistor 730 has a gate terminal connected to control signal B1 that is generated by the controller 764.

The transistor 734 has a source terminal connected to a drain terminal of the transistor 736. The transistor 734 has a gate terminal connected to control signal B4 that is generated by the controller 764.

The transistor 736 has a source terminal connected to the signal ground. The transistor 736 has a gate terminal connected to the first terminal of the capacitor 334.

A second branch includes transistors 738, 740, 742, and 744. A third branch includes transistors 746, 748, 750, and 752. The second and third branches are connected similarly to the first branch. Control signals B2 and B5 control the second branch and control signals B3 and B6 control the third branch.

In an exemplary embodiment, the transistor branches of the current slicer 704 have "M" designations that indicate the number of fingers for the transistors (e.g., the multiplier for the transistors). For example, if the transistor 340 has a width of W (um), then the transistor 730 is sized at W/4, the transistor 738 is sized at W/2, and the transistor 746 is sized at W/4. Thus, the transistors are sized to provide a ratio of 1:2:1 for the transistor they replaced. The same is true for all the transistor groups of the current slicer 704. It should also be noted that other sizes or ratios for the transistors can be used.

The controller 764 comprises at least one of a CPU, processor, gate array, hardware logic, discrete circuits, memory elements, and/or hardware executing software. The controller 764 is also configured to communicate with other entities at the wireless device using the communication line 766 to receive configuration information such as instructions, control information, data, configuration parameters, measurements and/or other information. The controller 764 uses the received configuration information to generate the control signals D(n) and B(n) to control the operation of the current diverter 702 and the current slicer 704 to set the gain of the amplification circuit shown in FIG. 7.

It should also be noted that the input impedance of the amplification circuit shown in FIG. 7 does not change with changing gain settings. For example, the input impedance is determined by the expression [1/(gm of transistor 314+gm of transistor 308)]. When the gain is changed, the operating conditions of transistor 314 and transistor 308 remain exactly the same as in the highest gain condition. Thus, when the gain is changed, just the drain current from transistor 314 is diverted among the transistors in the current diverter (718, 720, 722, 724, 726, and 728), which does not affect the input impedance. The same is true for the PMOS side that includes transistor 308. Therefore, no matter how the gain is changed, the input impedance remains the same, which provides for accurate gain steps. A detailed description of how the controller 764, current diverter 702, and current slicer 704 operate to set the gain of the amplifier 700 is provided below.

Figure 8:
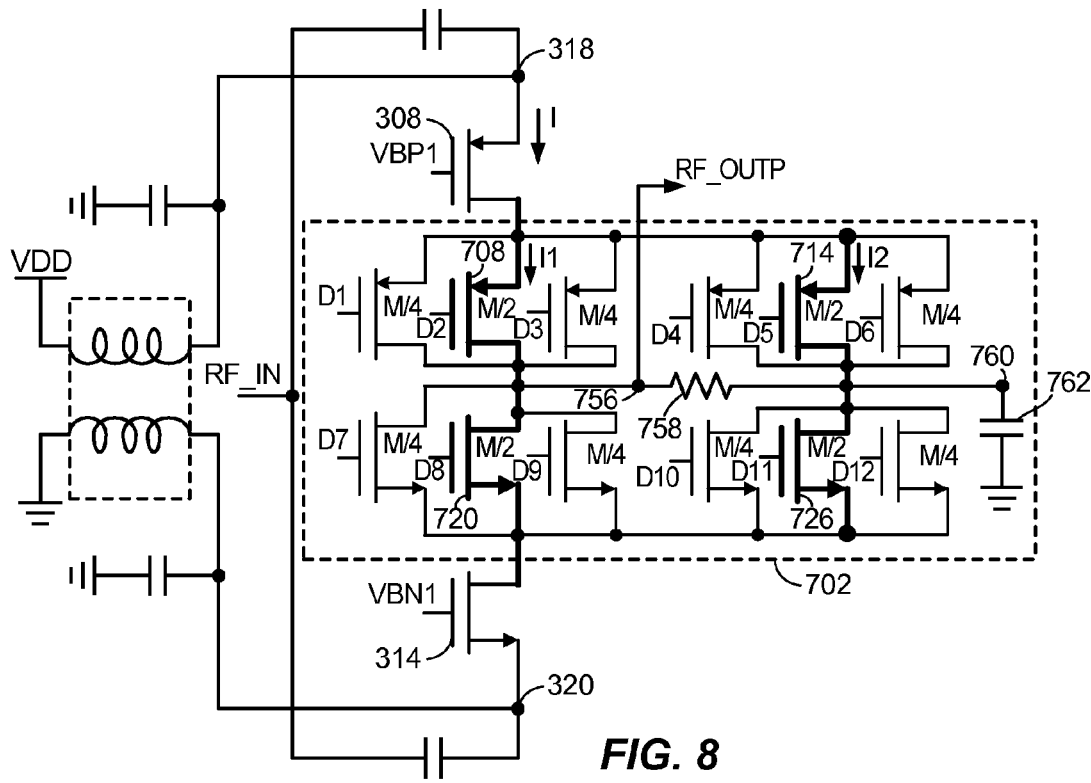
FIG. 8 illustrates exemplary operation of a current diverter used to set the gain of the amplification circuit shown in FIG. 7.

FIG. 8 illustrates the operation of the current diverter 702 to set the gain of the amplification circuit shown in FIG. 7. During operation, the controller 764 (not shown in FIG. 8) outputs the D(n) control signal to selectively enable or disable the transistors of the current diverter 702. For example, the controller 764 determines the states of the control signals D(n) based on received configuration information. It will be assumed for the purpose of this illustration that the controller 764 outputs the control signals D2, D5, D8, and D11 to be in the active state to enable the transistors 708, 714, 720, and 726, respectively, which are shown in bold. The remaining D(n) control signals are set to an inactive state to disable the remaining transistors of the current diverter 702.

When the RF input goes to a high level, the transistor 308 can be enabled by the bias signal VBP1 and the transistor 314 is disabled. When the transistor 308 is enabled by the RF input and the bias signal VBP1, current I flows through transistor 308 and is diverted through two signal paths. A current I1 flows in a first signal path through enabled transistor 708 and current I2 flows in a second signal path through the enabled transistor 714. The current I1 flows to the node 756 and is available for output. The current I2 flows to the capacitor 762 and to the signal ground. Thus, the gain of the amplifier stage 302 can be set by adjusting the current diverter to divert current away from the output node 756. Similar operation occurs when the RF input goes to a low level such that the transistor 308 is disabled and the transistor 314 is enabled. In this case, current I1 flows from the output through the transistor 720 and a current equal to I2 flows from the capacitor 762 through the transistor 726 to form the current I flowing through the transistor 314.

The controller 764 can output the D(n) control signals to enable or disable any of the transistors in the current diverter 702 so that various gain settings can be obtained as a result of diverting the current I through the transistors of the current diverter 702. Thus, the gain is increased when more transistors are enabled to divert more current to the output and fewer transistors are enabled to divert less current to the capacitor 762. The gain is decreased when fewer transistors are enabled to divert less current to the output and more transistors are enabled to divert more current to the capacitor 762.

Figure 9:
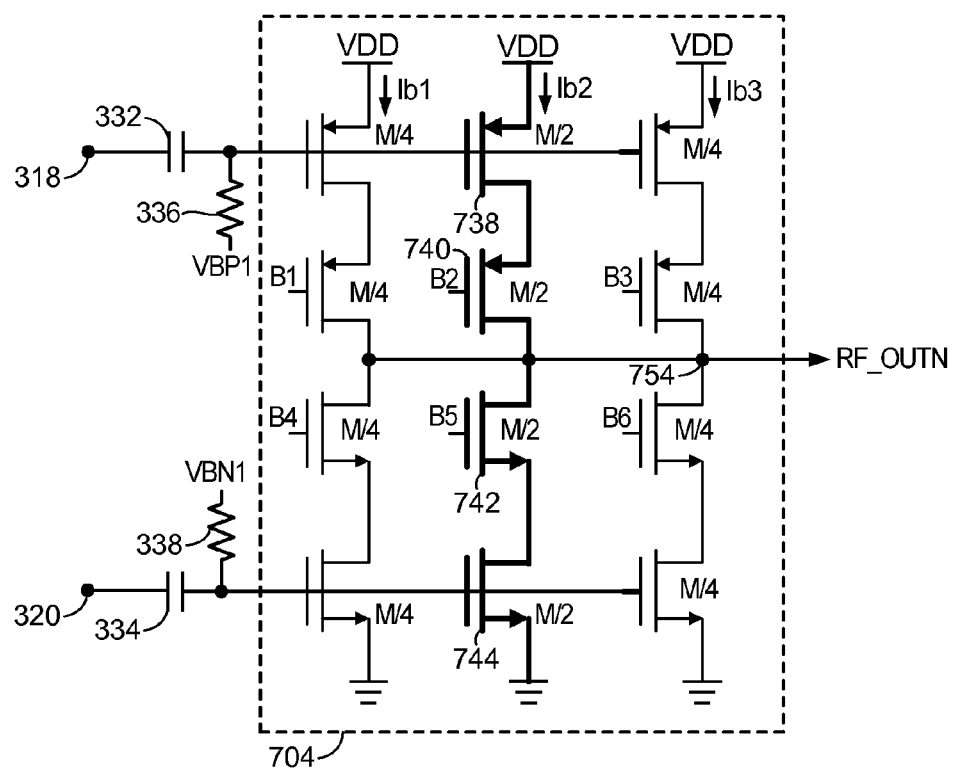
FIG. 9 illustrates exemplary operation of a current slicer used to set the gain of the amplification circuit shown in FIG. 7.

FIG. 9 illustrates the operation of the current slicer 704 to set the gain of the amplification circuit shown in FIG. 7. During operation, the controller 764 (not shown in FIG. 9) outputs the B(n) control signals to selectively enable or disable the branches of transistors of the current slicer 704. For example, the controller 764 determines the states of the control signals B(n) based on received configuration information. It will be assumed for the purpose of this illustration that the controller 764 outputs the control signals B2 and B5 to be in the active state to enable one branch that includes the transistors 738, 740, 742, and 744, respectively, which are shown in bold. The remaining B(n) control signals are set to an inactive state to disable the remaining branches of transistors of the current slicer 704.

When the transistors 740 and 742 are enabled by the B2 and B5 control signals, current Ib2 can flow through transistors 738, 740, 742, and 744. Since the remaining B(n) control signals disable transistors in the other branches, the currents Ib1 and Ib3 are prevented from flowing in those branches. During low (or negative) voltage levels of the RF input at node 318, the transistor 738 is enabled and the current Ib2 flows through transistor 740 (enabled by B2) to the node 754 and is available for output to generate the inverted RF_OUTN signal. The low (or negative) voltage levels of the RF input signal at node 320 disable the transistor 744 to prevent current flow to the signal ground. Alternatively, during high (positive) voltage levels of the RF input at node 318, the current Ib2 does not flow through the turned-off transistor 738 to the node 754. However, corresponding high (or positive) voltage levels of the RF input signal at node 320 enable the transistor 744 to cause the current Ib2 to flow from the node 754 to the signal ground thereby generating the inverted RF_OUTN signal.

Thus, the gain of the amplifier stage 304 can be set by adjusting the current slicer 704 to activate one or more branches to enable current to flow to/from the output node 756. The controller 764 can output the B(n) control signals to enable or disable branches of transistors in the current slicer 704 so that various gain settings can be obtained. For example, any combination of the first, second, and third branches can be enabled or disabled to control whether or not the currents Ib1, Ib2, and Ib3 flow through their respective branches. Furthermore, when one or more branches of the current slicer 704 are disabled, a corresponding savings in current results.

Figure 10:
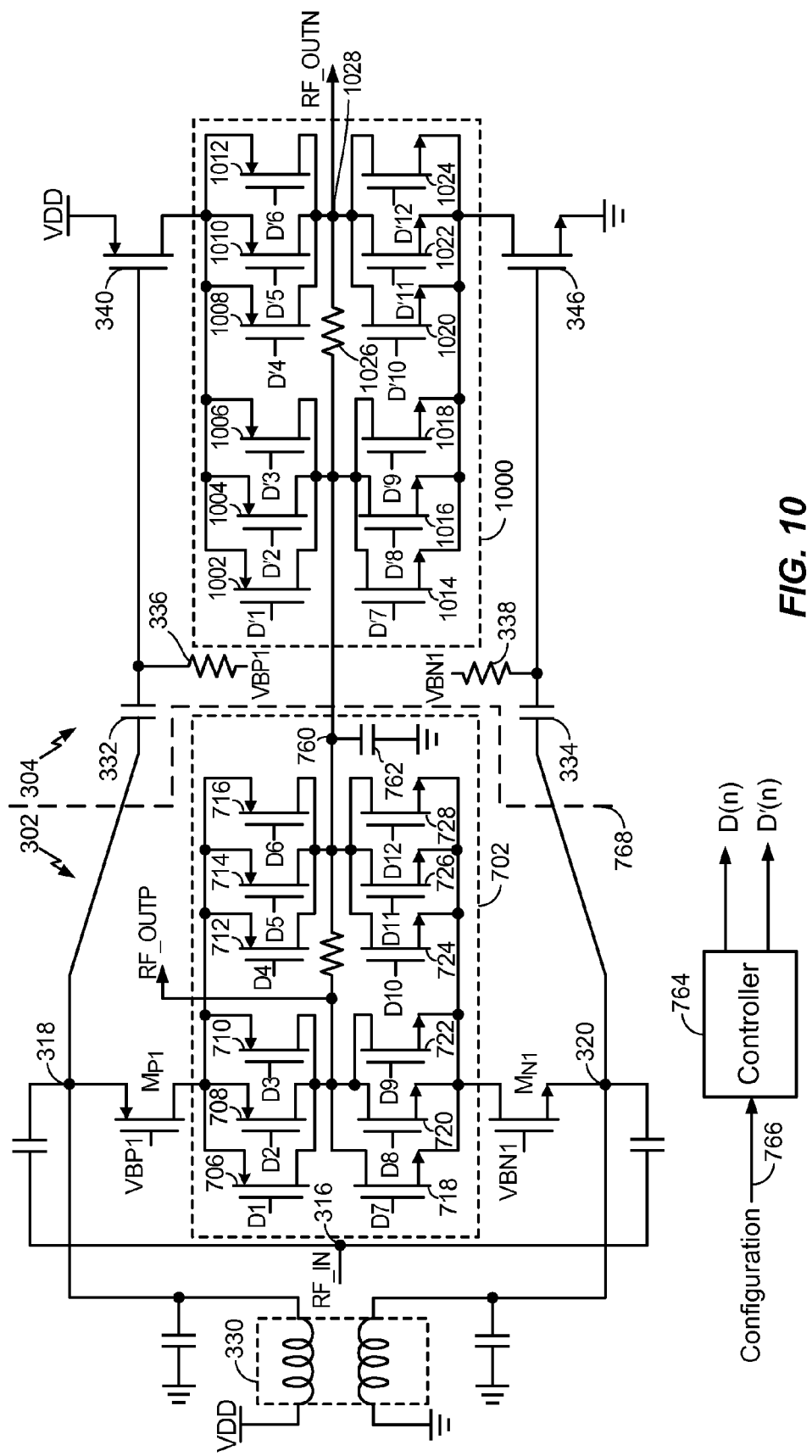
FIG. 10 shows a detailed exemplary embodiment of the amplification circuit shown in FIG. 3 that is expanded to include gain control.

FIG. 10 shows a detailed exemplary alternative embodiment of the amplification circuit 300 that is expanded to include gain control. For example, the amplifier stage 302 is expanded to include a current diverter 702, which operates to set the gain of the complementary common gate amplifier stage 302 as described above. The complementary common source amplifier stage 304 is expanded to include a current diverter 1000 that operates to set the gain similarly to the current diverter 702. The controller 764 outputs control signals D(n) and D' (n) to control the operation of the current diverter 702 and the current diverter 1000.

In an exemplary embodiment, the transistors 342, 344 of the complementary common source amplifier stage 304 are replaced with the current diverter 1000. The current diverter 1000 includes two groups of PMOS transistors and two groups of NMOS transistors. The first group of PMOS transistors includes transistors 1002, 1004, and 1006. The transistors 1002, 1004, and 1006 have source terminals connected to the drain terminal of transistor 340 and have drain terminals connected to node 760, which is also connected to a first terminal of a resistor 1026 (e.g., 1-5 kohms). The inverted output signal RF_OUTN is output from the node 1028 that is connected to a second terminal of the resistor 1026. The transistors 1002, 1004, and 1006 have gate terminals connected to receive control signals D'1, D'2, and D'3, respectively, which are generated by the controller 764.

The second group of PMOS transistors includes transistors 1008, 1010, and 1012. The transistors 1008, 1010, and 1012 have source terminals connected to the drain terminal of transistor 340 and have drain terminals connected to node 1028. The node 1028 is connected to a second terminal of the resistor 1026. The transistors 1008, 1010, and 1012 have gate terminals connected to receive control signals D'4, D'S, and D'6, respectively, which are generated by the controller 764.

The first group of NMOS transistors includes transistors 1014, 1016, and 1018. The transistors 1014, 1016, and 1018 have source terminals connected to the drain terminal of transistor 346 and have drain terminals connected to node 760. The transistors 1014, 1016, and 1018 have gate terminals connected to receive control signals D'7, D'8, and D'9, respectively, which are generated by the controller 764.

The second group of NMOS transistors includes transistors 1020, 1022, and 1024. The transistors 1020, 1022, and 1024 have source terminals connected to the drain terminal of transistor 346 and have drain terminals connected to node 1028. The transistors 1020, 1022, and 1024 have gate terminals connected to receive control signals D'10, D'11, and D'12, respectively, which are generated by the controller 764.

Figure 11:
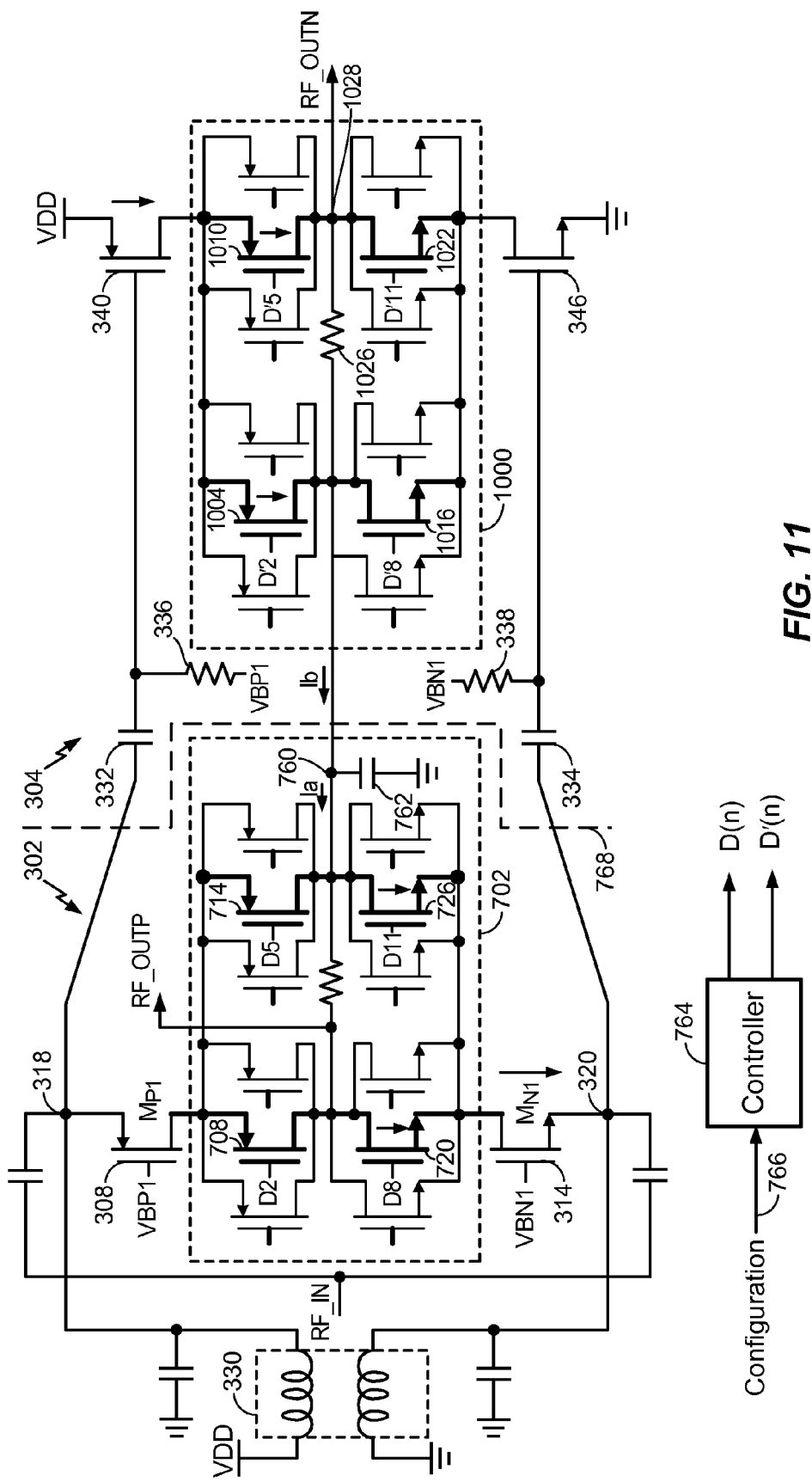
FIG. 11 illustrates exemplary operation of the amplification circuit with gain control shown in FIG. 10.

FIG. 11 illustrates the operation of the current diverters 702 and 1000 to set the gain of the amplifier shown in FIG. 10. During operation, the controller 764 outputs the D(n) control signal to selectively enable or disable the transistors of the current diverter 702. For example, the controller 764 determines the states of the control signal D(n) based on received configuration information. It will be assumed for the purpose of this illustration that the controller 764 outputs the control signals D2, D5, D8 and D11 to be in the active state to enable the transistors 708, 714, 720, and 726, respectively, which are shown in bold. The remaining D(n) control signals are set to an inactive state to disable the remaining transistors of the current diverter 702.

The controller 764 also outputs the D' (n) control signal to selectively enable or disable the transistors of the current diverter 1000. For example, the controller 764 determines the states of the control signal D' (n) based on received configuration information. It will be assumed for the purpose of this illustration that the controller 764 outputs the control signals D'2, D'5, D'8 and D' 11 to be in the active state to enable the transistors 1004, 1010, 1016, and 1022, respectively, which are shown in bold. The remaining D'(n) control signals are set to an inactive state to disable the remaining transistors of the current diverter 1000.

With the control signals set as described above, when the RF input signal goes low, transistors 314 and 340 are enabled and transistors 308 and 346 are disabled. In the current slicer 702, the current flows through enabled transistors 720 and 726 as indicated by the arrows. The current (Ia) flowing out of the node 760 flows through the enabled transistor 726. In the current slicer 1000, the current flows through enabled transistors 1004 and 1010 as indicated by the arrows. The current (Ib) flowing into the node 760 flows through the enabled transistor 1004.

In this exemplary embodiment, the node 760 forms a virtual AC signal ground. The currents Ia and Ib flow in opposite directions at this node. A small amount of current may flow through the capacitor 762. However, due to this small amount of current, the capacitor 762 can be small in size. For example, the capacitor 762 only needs to be large enough to provide an impedance comparable to the input impedance of the summation circuit. In an exemplary embodiment, the summation circuit is a passive network and therefore just reflects the input impedance of a downstream mixer coupled to the amplifier circuit shown in FIG. 11.

Figure 12:
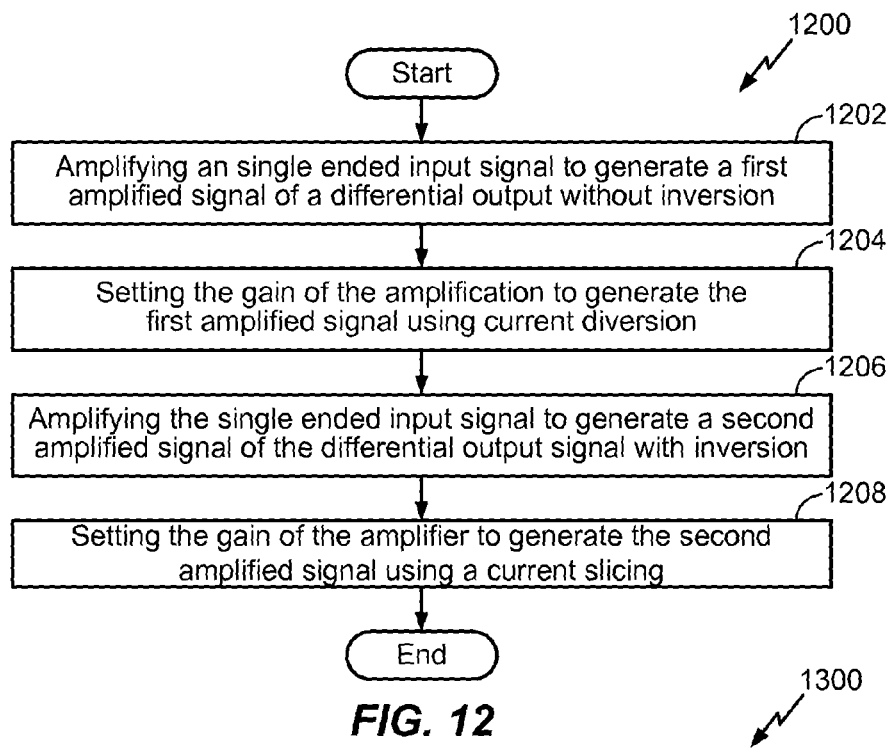
FIG. 12 shows exemplary operations performed by exemplary embodiments of the amplification circuits shown in FIG. 7 and FIG. 10.

FIG. 12 shows exemplary operations performed by exemplary embodiments of the amplification circuits shown in FIG. 7 and FIG. 10. For example, in an exemplary embodiment, the amplification circuit shown in FIG. 7 performs the operations 1200 to generate amplified signals in a device, such as the wireless device 110 shown in FIG. 1.

During operation 1202, amplification of an input signal is performed to generate a first amplified signal of a differential output. The amplification is performed without signal inversion. For example, the complementary common gate amplifier stage 702 performs this operation.

During operation 1204, the amplification gain used to generate the first amplified signal is set using current diversion. For example, the controller 764 outputs the control signals D(n) to control the transistors of the current diverter 702 to perform this operation.

During operation 1206, amplification of the input signal is performed to generate a second amplified signal of the differential output. The amplification is performed with signal inversion. For example, the complementary common source amplifier stage 704 performs this operation.

During operation 1208, the amplification gain used to generate the second amplified signal is set using current slicing. For example, the controller 764 outputs the control signals B(n) to control the transistors of the current slicer 704 to perform this operation. Alternatively, the current diverter 1000 is used to perform this operation.

Accordingly, the amplification circuits shown in FIG. 7 and FIG. 10 perform the operations described above. It should be noted that the operations 1200 are exemplary and that minor changes, modifications, rearrangements and other changes to the operations 1200 are within the scope of the exemplary embodiments.

Figure 13:
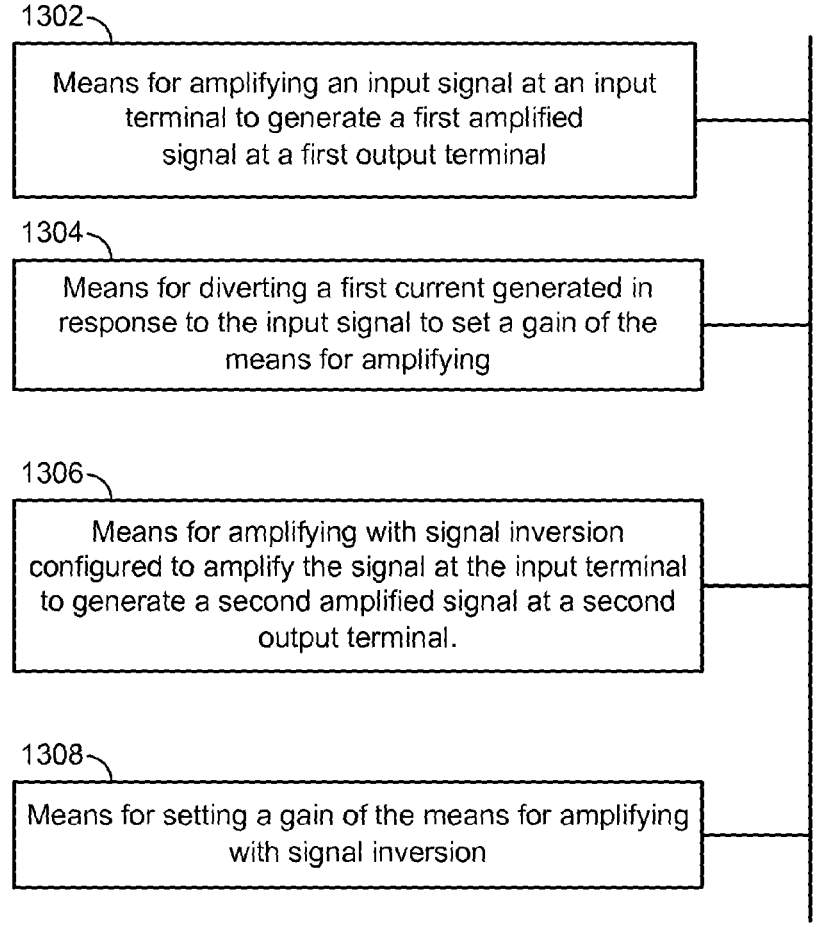
FIG. 13 shows an exemplary embodiment of an amplification apparatus.

FIG. 13 shows an exemplary embodiment of an amplification apparatus 1300. In an exemplary embodiment, the apparatus 1300 is suitable for use as the amplification circuit shown in FIG. 7.

The apparatus 1300 includes a first means (1302) for amplifying an input signal at an input terminal to generate a first amplified signal at a first output terminal, which in an exemplary embodiment comprises the amplifier stage 302 shown in FIG. 7.

The apparatus 1300 also comprises a second means (1304) for diverting current generated in response to the input signal to set a gain of the means for amplifying, which in an exemplary embodiment comprises the current diverter 702.

The apparatus 1300 also comprises a third means (1306) for amplifying with signal inversion configured to amplify the signal at the input terminal to generate a second amplified signal at a second output terminal, which in an exemplary embodiment comprises the amplifier stage 304 shown in FIG. 7.

The apparatus 1300 also comprises a fourth means (1308) for setting a gain of the means for amplifying with signal inversion, which in an exemplary embodiment comprises the current slicer 704 or the current diverter 1000.

The exemplary embodiments of an amplification circuit described herein may be implemented on an IC, an analog IC, an RFIC, a mixed-signal IC, an ASIC, a printed circuit board (PCB), an electronic device, etc. The exemplary embodiments of the amplification circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an exemplary embodiment of an amplification circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, firmware, or any combination thereof. If implemented by hardware executing software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but the disclose is to be accorded the widest scope consistent with the principles and novel features disclosed herein.

What is claimed is:

1. An apparatus comprising:
    a first amplifier stage configured to amplify an input signal at an input terminal to generate a first amplified signal, the first amplifier stage having a current diverter configured to selectively divert a first current to set a gain of the first amplifier stage,
    wherein the first amplifier stage is configured as a complementary common gate (CCG) amplifier that generates the first amplified signal as non-inverted with respect to the input signal and the second amplifier stage is configured as a complementary common source (CCS) amplifier that generates the second amplified signal as inverted with respect to the input signal; and
    a second amplifier stage configured to amplify the input signal at the input terminal to generate a second amplified signal, the second amplifier stage having a gain control circuit to set a gain of the second amplifier stage.

2. The apparatus of claim 1, the gain control circuit comprising parallel branches of complimentary cascode transistors that are selectively enabled to set the gain of the second amplifier stage.

3. The apparatus of claim 2, further comprising a controller configured to output control signals to control the current diverter to set the gain of the first amplifier stage and to control the gain control circuit to set the gain of the second amplifier stage.

4. The apparatus of claim 3, the controller configured to output first control signals to control the current diverter to divert a selected amount of the first current to a node that forms an AC ground to set the gain of the first amplifier stage to a selected gain setting, and the controller configured to output second control signals to selectively enabled the parallel branches of the complimentary cascode transistors to set the gain of the second amplifier stage to the selected gain setting.

5. The apparatus of claim 1, the gain control circuit comprising a second current diverter configured to divert a selected amount of a second current to set the gain of the second amplifier stage.

6. An apparatus comprising:
    a first amplifier stage configured to amplify an input signal at an input terminal to generate a first amplified signal, the first amplifier stage having a current diverter configured to selectively divert a first current to set a gain of the first amplifier stage;
    a second amplifier stage configured to amplify the input signal at the input terminal to generate a second amplified signal, the second amplifier stage having a gain control circuit to set a gain of the second amplifier stage,
    the gain control circuit comprising a second current diverter configured to divert a selected amount of a second current to set the gain of the second amplifier stage, the current diverter configured to divert a selected amount of the first current to a node and the second current diverter configured to divert the selected amount of the second current to the node, the node forms an AC signal ground.

7. The apparatus of claim 6, further comprising a capacitor coupled between the node and a signal ground, the selected amounts of the first and second currents flowing in opposite directions at the node resulting in a third current flowing between the node and the capacitor that is less than the first or second currents.

8. The apparatus of claim 6, further comprising a controller configured to output control signals to control the current diverter to set the gain of the first amplifier stage and to control the second current diverter to set the gain of the second amplifier stage.

9. The apparatus of claim 1, further comprising a summation circuit configured to receive the first and second amplified signals and to output a differential signal.

10. The apparatus of claim 9, the summation circuit comprising a bias signal generator that generates a bias signal that biases the first and second amplifier stages.

11. The apparatus of claim 10, the summation circuit comprising a transformer that receives the first and second amplified signals across a first winding, the first winding having a center tap that outputs a common mode voltage signal to the bias signal generator.

12. An apparatus comprising:
means for amplifying an input signal at an input terminal to generate a first amplified signal at a first output terminal, the first amplified signal non-inverted with respect to the input signal;
means for diverting a first current generated in response to the input signal to set a gain of the means for amplifying;
means for amplifying with signal inversion configured to amplify the signal at the input terminal to generate a second amplified signal at a second output terminal, the second amplified signal inverted with respect to the input signal; and
means for setting a gain of the means for amplifying with signal inversion, the means for setting the gain comprising parallel branches of complimentary cascode transistors that are selectively enabled to set the gain of the means for amplifying with signal inversion.

13. The apparatus of claim 12, the means for amplifying comprising a complementary common gate (CCG) amplifier that generates the first amplified signal.

14. The apparatus of claim 12, the means for amplifying with signal inversion comprising a complementary common source (CCS) amplifier that generates the second amplified signal.

15. The apparatus of claim 12, the means for diverting the first current configured to steer a selected portion of the first current to a node that forms an AC signal ground.

16. The apparatus of claim 15, further comprising a capacitor coupled between the node and a signal ground.

17. The apparatus of claim 12, the means for setting the gain comprising means for diverting a second current to set the gain of the means for amplifying with signal inversion.

18. The apparatus of claim 12, further comprising means for controlling that outputs control signals to control the means for diverting the first current and the means for setting the gain.

* * * * *